United States Patent [19]

Vanderhoydonck et al.

[11] Patent Number: 5,045,718
[45] Date of Patent: Sep. 3, 1991

[54] CIRCUIT FOR DETECTING POWER SUPPLY VOLTAGE VARIATION

[75] Inventors: Kris T. P. Vanderhoydonck, Zolder, Belgium; Bernardus H. J. Cornelissen, Bergeijk, Netherlands

[73] Assignee: U.S. Philips Corp., New York, N.Y.

[21] Appl. No.: 590,452

[22] Filed: Sep. 24, 1990

Related U.S. Application Data

[63] Continuation of Ser. No. 350,827, May 11, 1989, abandoned.

[30] Foreign Application Priority Data

May 16, 1988 [NL] Netherlands .......................... 8801253

[51] Int. Cl.$^5$ .......................... H03K 3/01; H03K 3/38; H03K 5/153
[52] U.S. Cl. .............................. 307/296.4; 307/296.3; 307/296.5; 307/306; 307/350; 330/257
[58] Field of Search .............. 307/296.3, 296.4, 296.5, 307/350, 306; 330/257

[56] References Cited

U.S. PATENT DOCUMENTS

| 4,649,292 | 3/1987 | Rusznyak | 307/296.5 |
| 4,697,097 | 9/1987 | Rusznyak | 307/296.4 |
| 4,767,942 | 8/1988 | Minami et al. | 330/288 |

Primary Examiner—Stanley D. Miller
Assistant Examiner—M. Wambach
Attorney, Agent, or Firm—Steven R. Biren

[57] ABSTRACT

A circuit for detecting a variation in power supply voltage includes first transistor (PM1) arranged as a current source and connected to the input (K1) of a current mirror (NM1, NM2), whose output (K2) is connected to a second transistor (PM2) arranged as a current source and to the output of the circuit. In the event of a temporary decrease in supply voltage this circuit will produce a pulse-shaped signal on its output, which signal can be employed as a trigger signal such as a reset signal in bistable circuits.

3 Claims, 3 Drawing Sheets

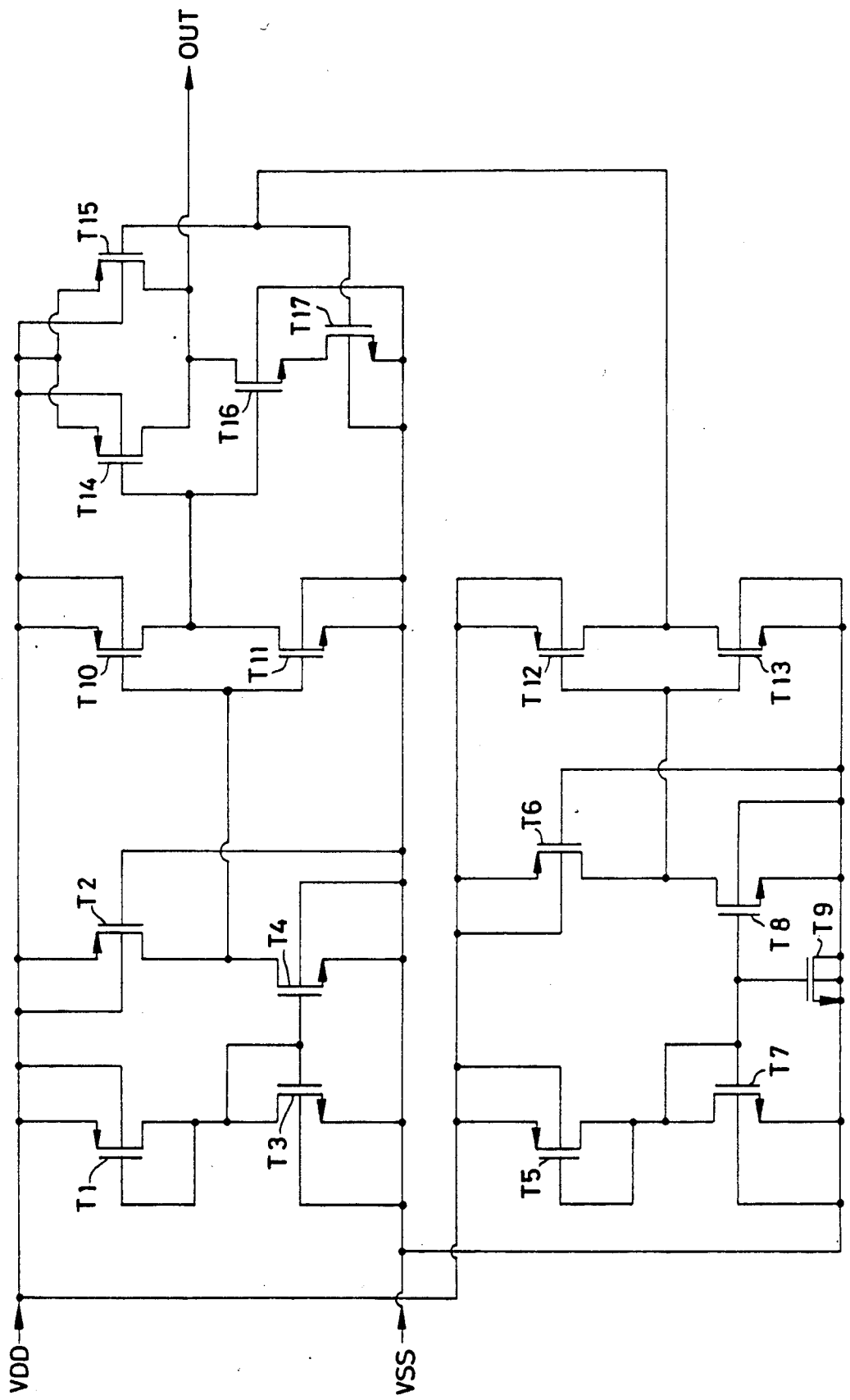

CIRCUIT FOR DETECTING POWER SUPPLY VOLTAGE VARIATION

This is a continuation of application Ser. No. 350,827, filed May 11, 1989 abandoned.

BACKGROUND OF THE INVENTION

The invention relates to a circuit for generating a pulse-shaped signal on an output terminal of the circuit in the case of a predetermined variation of the supply voltage on two power-supply terminals of the circuit. The circuit includes:
- a first transistor of a first conductivity type, having its main current path arranged between a first power-supply terminal and a first junction point,
- a second transistor of the first conductivity type, having its main current path arranged between the first power-supply terminal and a second junction point,
- a first transistor of a second conductivity type, having its main current path arranged between a second power-supply terminal and the first junction point,
- a second transistor of the second conductivity type, having its main current path arranged between the second power-supply terminal and the second junction point,
- the output terminal being connected to the second junction point,
- the gate terminals of the first and second transistors of the first conductivity type being connected to each other and to the first junction point, and the gate terminal of the second transistor of the second conductivity type being connected to the first power-supply terminal.

In electronic bistable circuits, in particular circuits in MOS-technology, a temporary decrease of the supply voltage may result in an indeterminate state of the bistable arrangement and hence a loss of information. Depending on the nominal supply voltage (for example 5 V) and depending on the technology employed the information content of the bistable circuit will no longer be guaranteed if the supply voltage decreases below a specified limit value (for example 3.2 V). If this decrease is caused by intentionally turning off the supply voltage, most electronic devices will generate a power-on pulse in order to reset all bistable circuits to a predetermined initial state when the supply voltage is subsequently turned on.

However, in the case of an unintentional temporary decrease of the supply voltage below said limit value the information in the bistable circuit may change in an indeterminate manner. If subsequently the supply voltage is restored to the nominal value a situation arises in which the instaneously-stored information is not reliable, which may lead to various undesired effects. In such a situation it would therefore also be desirable to generate a reset signal.

A circuit as described above is known from U.S. Pat. No. 4,697,097. The first transistor of the second conductivity type forms the output transistor of a current mirror circuit having an input transistor which is arranged in series with a capacitor between the supply terminals. When the supply voltage is switched on, the charging current of the capacitor is reproduced in the drain of the second transistor of the first conductivity type via this current mirror circuit and via the multiplying current mirror circuit formed by the first and the second transistor of the first conductivity type. Since initially this current is greater than the drain current of the second transistor of the second conductivity type, the voltage at the output node will assume a low value. When the supply voltage reaches its nominal value, the charging current of the capacitor will reduce to zero. The drain current of the second transistor of the second conductivity type will become greater than that of the second transistor of the first conductivity type and as a consequence the voltage at the output node will switch from a low to a high value, so that a reset signal is generated. However, a drawback of this known circuit is that due to the presence of the capacitor no reset signal is generated when temporary decreases of the supply voltage occur.

SUMMARY OF THE INVENTION

It is therefore an object of the invention to provide a circuit by means of which a pulse-shaped signal is generated if the supply voltage decreases below said limit value, below which the stored information is no longer reliable.

According to the invention this object is achieved by
- the gate terminal of the first transistor of the second conductivity type being connected to the first junction point,
- and the transistors being dimensioned in such a way that in operation in the case of a supply voltage above a predetermined limit value the voltage on the output terminal approximates to the voltage on the first power-supply terminal and in the case of a supply voltage below the predetermined limit value the voltage on the output terminal approximates to the voltage on the second power-supply terminal.

When the supply voltage rises from a comparatively low value the second transistor of the second conductivity type will initially be turned on and some time after this the first transistors of the first and the second conductivity type will be turned on. The second transistor of the second conductivity type will temporarily pull the output towards the instantaneous supply voltage and thereby generate an output pulse. Moreover, when now the supply voltage temporarily decreases below a predetermined value the second transistor of the second conductivity type will pull the voltage at the output node towards the supply voltage and consequently generate a reset signal.

In situations in which the increase up to the nominal supply voltage proceeds very rapidly it may occur that the second transistor of the second conductivity type is not allowed to change the voltage on the output, so that no voltage pulse is generated. In that case it is preferred to arrange a capacitive element between the first junction point and the first power-supply terminal.

BRIEF DESCRIPTION OF THE DRAWING

The invention will now be described in more detail, by way of example, with reference to the accompanying Figures, in which:

FIG. 5 shows a third embodiment of a circuit in accordance with the invention.

DESCRIPTION OF THE PREFERRED EMBODIMENTS

Figure 1:
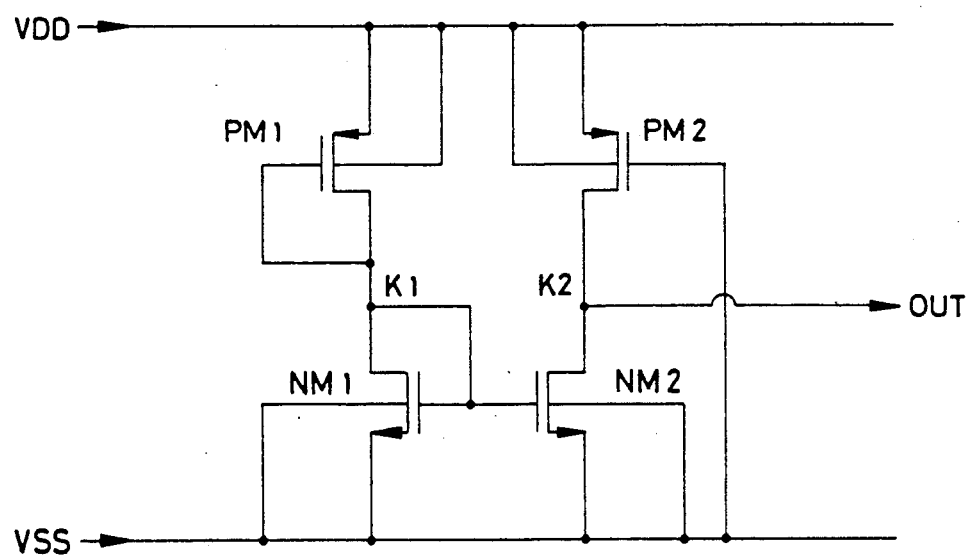
FIG. 1 shows a first embodiment of a circuit in accordance with the invention.

FIG. 1 shows a first embodiment of a circuit in accordance with the invention. The circuit comprises four transistors, namely the PMOS transistors PM1 and PM2 and the NMOS transistors NM1 and NM2. The main current paths of the transistors NM1 and NM2 are arranged between the power-supply terminal $V_{SS}$ and a first junction point k1 and a second junction point k2, respectively. The main current paths of the transistors PM1 and PM2 are arranged between the other power-supply terminal $V_{DD}$ and the first junction point k1 and the second junction point k2, respectively. The gate terminals of the transistors NM1 and NM2 are interconnected and connected to the first junction point k1, so that the two transistors NM1 and NM2 constitute a current-mirror circuit. The gate terminal of PM1 is connected to the junction point k1 and the gate terminal PM2 is connected to the supply voltage terminal $V_{SS}$. The output of the circuit is connected to the junction point k2.

Figure 2A:
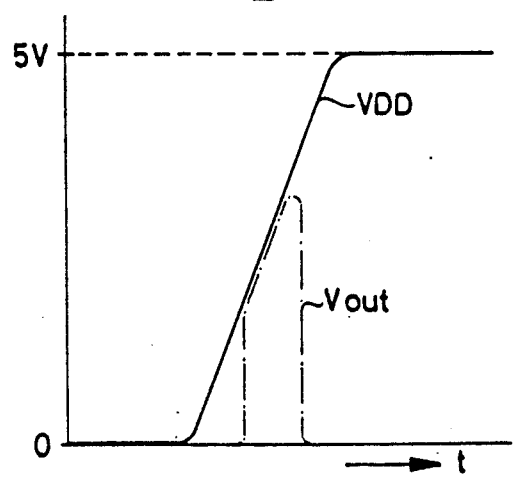
FIG. 2 shows voltage voltage waveforms to illustrate the operation of the circuit shown in FIG. 1.

The operation of the circuit shown in FIG. 1 will be explained with reference to FIG. 2. FIG. 2A shows how the output voltage Vout behaves if the supply voltage $V_{DD}$ increases from 0 to the nominal value (which is 5 V in the example of FIG. 2A). If the supply voltage $V_{DD}$ gradually increases as indicated in FIG. 2A, the transistor PM2 will be turned on if one of the PMOS threshold-voltage values is exceeded, causing the voltage on the output OUT to become equal to the instantaneous supply voltage $V_{DD}$. In FIG. 2A this is indicated by a dash-dot line. If subsequently the supply voltage becomes higher than one PMOS threshold-voltage value + one NMOS threshold voltage value the two transistors PM1 and NM1 will be turned on. Since the transistors NM1 and NM2 constitute a current mirror, NM2 will also be turned on. As soon as the current through NM2 becomes larger than the current through PM2 the output OUT will be pulled to 0. In other words, the output voltage Vout decreases to 0 in a manner as shown in FIG. 2A as soon as the voltage $V_{DD}$ has reached a predetermined value. The dimensions of the various transistors can be selected in such a way that for a predetermined value of the supply voltage $V_{DD}$, which value can be influenced by the transistor dimensions, the output voltage Vout becomes 0. For example, the width/length ratio (W/L) of the transistor PM1 may then be selected to be larger than that of the transistors NM1 and NM2. However, it is alternatively possible to select this ratio to be substantially equal for the transistors PM1 and PM2 and to give the transistor NM2 a larger length/width ratio than the transistor NM1.

Figure 2B:
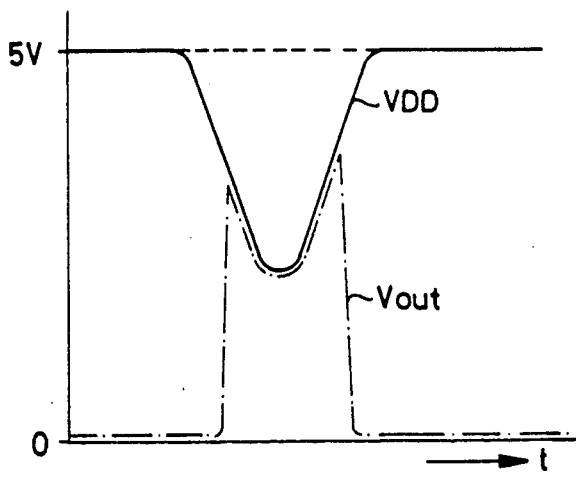

FIG. 2B illustrates what happens if the supply voltage $V_{DD}$ temporarily decreases below its nominal value. If the supply voltage $V_{DD}$ decrease below the limit value for which the current through PM2 is smaller than the current through NM2, the output voltage Vout will be pulled up from the zero level at this instant and will become substantially equal to the instantaneous supply voltage $V_{DD}$. If subsequently the supply voltage $V_{DD}$ increases in a manner as illustrated in FIG. 2B the limit value will be crossed again, the current through NM2 will be larger than the current through PM2 and the output voltage Vout will be pulled to zero again. It will be apparent from FIG. 2B that owing to the temporary decrease of the supply voltage $V_{DD}$ a pulse-shaped signal Vout will be pulled to zero again. It will be apparent from FIG. 2B that owing to the temporary decrease of the supply voltage $V_{DD}$ a pulse-shaped signal Vout will appear on the output OUT. This pulse-shaped signal Vout can be used as a reset signal for resetting the flip-flops, whose information content may have become indeterminate as a result of the temporary decrease in supply voltage, to a predetermined state.

If the supply voltage $V_{DD}$ rises very rapidly from 0 to 5 V PM1 and NM1 will be turned on so fast that the transistor PM2 has no opportunity to pull the output OUT briefly towards the supply-voltage level $V_{DD}$. In other words, if the supply voltage $V_{DD}$ rises very rapidly to its nominal value no pulse-shaped output signal, which can be used as a reset signal for the information-latching flip-flops, will appear on the output OUT.

Figure 3:
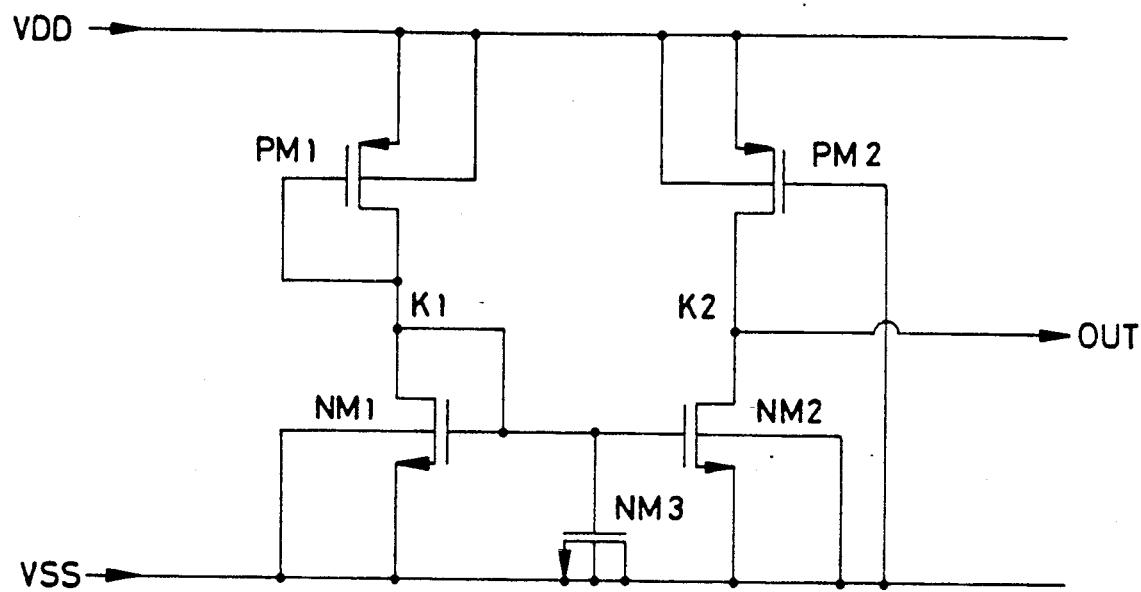
FIG. 3 shows a second embodiment of a circuit in accordance with the invention.

FIG. 3 shows a modification of the circuit shown in FIG. 1, which also provides a pulse-shaped signal in the event of a very rapid rise in supply voltage. The circuit shown in FIG. 3 comprises a further NMOS transistor NM3, which serves as a capacitive element arranged between the common gate line of the transistors NM1 and the power-supply terminal $V_{SS}$.

Figure 4:
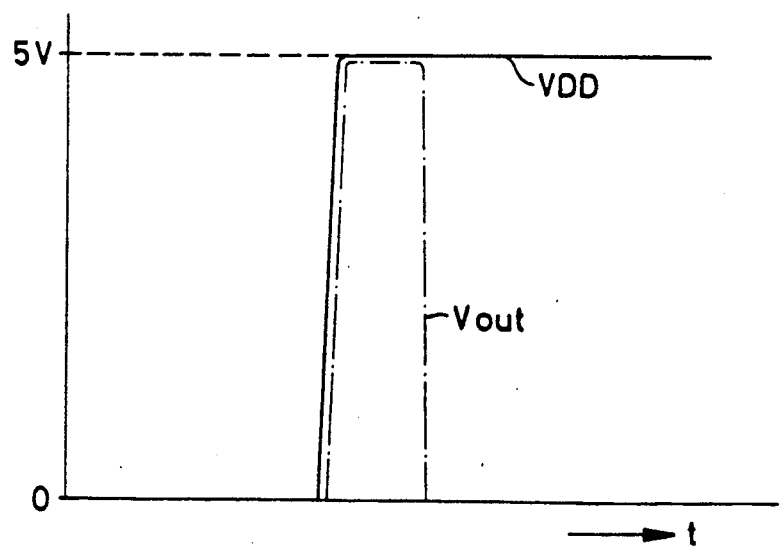
FIG. 4 shows voltage waveforms to illustrate the operation of the circuit shown in FIG. 3.

If in this circuit arrangement the supply voltage $V_{DD}$ rises very rapidly from 0 to its nominal value (in the present example also 5 V) and the value of one PMOS threshold voltage is exceeded, the transistor PM2 will be turned on and pull the output to $V_{DD}$. Immediately after this the transistors PM1 and NM1 will be turned on, but as a result of the presence of the capacitive element NM3 the transistor NM2 will not be turned on immediately. Once the capacitive element NM3 has been charged sufficiently NM2, which together with NM1 is arranged as a current mirror, will also be turned on and thereby pull the output OUT to 0 in a manner as described in the foregoing. Thus, on account of the presence of NM3 an output pulse, as shown in FIG. 4, will be generated on the output OUT even in the case of a very rapid rise in the supply voltage. In the present case the width of the output pulse depends directly on the capacitance value of NM3. Consequently, this width can be influenced by a suitable choice of the parameters of the transistor NM3.

However, the presence of the capacitive element NM3 has the drawback that in the case of a temporary decrease of the supply voltage the transistor NM2 will remain conductive until NM3 has had enough time to allow it to be discharged. However, if within this time interval the supply voltage has increased to its nominal value no output pulse will be generated on the output OUT. In order to preclude this, it is preferred to combine the circuit shown in FIGS. 1 and 3 in a manner as illustrated in FIG. 5.

The circuit shown in FIG. 5 comprises the transistors T1 to T17. As is apparent from FIG. 5, the transistors T1 to T4 form a circuit section which is identical to the circuit shown in FIG. 1. The transistors T5 to T9 constitute a circuit section which is identical to the circuit illustrated in FIG. 3. The two circuit sections are connected to the same power-supply terminals $V_{DD}$ and $V_{SS}$. The transistors T10 and T11 and the transistors T12 and T13 constitute inverting buffer stages with which the output signals of the first and the second circuit sections are transferred to a NAND-circuit comprising the transistors T14 to T17. In this way the transistors T10 to T17 constitute an OR-circuit. The operation of this OR circuit will be apparent to those skilled in the art, for which reason these circuits will not be described in more detail.

It will be evident that the circuit shown in FIG. 5 will always generate a pulse on the output OUT both in the case of a rapid and a slow rise of the supply voltage, which pulse will be generated either by the first circuit section comprising the transistors T1 to T4 or the second circuit section comprising the transistors T5 to T9, or by both circuit sections.

We claim:

1. A circuit for generating a pulse signal on an output terminal of the circuit to indicate a predetermined variation of the supply voltage above or below its nominal operating value on two power-supply terminals of the circuit, comprising:
    a first field effect transistor of a first conductivity type, having its main current path coupled between a first power-supply terminal and a first junction point,
    a second field effect transistor of the first conductivity type, having its main current path coupled between the first power-supply terminal and a second junction point,
    a first field effect transistor of a second conductivity type, having its main current path coupled between a second power-supply terminal and the first junction point,
    a second field effect transistor of the second conductivity type, having it main current path coupled between the second power-supply terminal and the second junction point,
    the output terminal being connected to the second junction point,
    the gate terminals of the first and the second transistors of the first conductivity type being connected to each other and to the first junction point, and the gate terminal of the second transistor of the second conductivity type being connected to the first power-supply terminal,
    characterized in that the gate terminal of the first transistor of the second conductivity type is connected to the first junction point,
    and means for controlling the voltage on the output terminal, said means comprising dimensioning the transistors such that in operation in the case of a supply voltage above a predetermined limit value the voltage on the output terminal approximates the voltage on the first power-supply terminal and in the case of a supply voltage below the predetermined limit value but substantially above zero volts the voltage on the output terminal approximates the voltage on the second power-supply terminal.

2. A circuit as claimed in claim 1, characterized in that a capacitive element is coupled between the first junction point and the first power-supply terminal.

3. A circuit as claimed in claim 2, characterized in that said capacitive element comprises a third field effect transistor of the first conductivity type, whose main current path is short-circuited and connected to the first power-supply terminal and whose gate terminal is connected to the first junction point.

* * * * *